(12) United States Patent
Howell

(10) Patent No.: US 7,955,086 B1
(45) Date of Patent: Jun. 7, 2011

(54) SOCKET CONNECTOR WITH VENTED PICK UP CAP THEREON

(75) Inventor: David Gregory Howell, Chandler, AZ (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/830,458

(22) Filed: Jul. 6, 2010

(51) Int. Cl.
*H01R 13/60* (2006.01)

(52) U.S. Cl. .......................... 439/41; 439/135; 439/940

(58) Field of Classification Search .................. 439/41, 439/940, 135
See application file for complete search history.

(56) References Cited

U.S. PATENT DOCUMENTS

| 6,875,022 | B2 | 4/2005 | HonHai | |
|---|---|---|---|---|
| 7,140,890 | B1 | 11/2006 | Lotes | |
| 7,503,781 | B2 * | 3/2009 | Chang | 439/135 |
| 7,866,985 | B2 * | 1/2011 | Hsu | 439/41 |

* cited by examiner

*Primary Examiner* — Hae Moon Hyeon
(74) *Attorney, Agent, or Firm* — Andrew C. Cheng; Wei Te Chung; Ming Chieh Chang

(57) ABSTRACT

A socket connector includes an insulative housing defining an upper surface and a bottom surface, a plurality of contacts received in the housing, and a pick up cap assembly mounted upon the housing and covering the contacts. The pick up cap assembly includes a pick up cap having an opening exposed to contacts, and a deformable shield secured onto the pick up cap and covering the opening. The shield includes two layers having different coefficient of thermal expansion so that the shield warps upward when exposed to a heat, allowing heat to reach to the upper surface of the housing.

14 Claims, 5 Drawing Sheets

SOCKET CONNECTOR WITH VENTED PICK UP CAP THEREON

BACKGROUND OF THE INVENTION

1. Field of the Invention

The present invention relates to a socket connector, and more particularly to a socket connector having a vented pick up cap mounted thereon capable of efficiently protecting the contacts in the socket connector.

2. Description of Related Art

An IC package, such as a CPU (Central Processing Unit), is generally coupled with a system via a socket connector mounted on a PCB (Printed Circuit Board). A typical socket connector is disclosed by U.S. Pat. No. 7,140,890 issued to Ted Ju on, on Nov. 28, 2006. Referring to FIG. 2 to FIG. 4 of this patent, the socket connector includes a socket body and a pick up cap mounted upon the socket body. A plurality of contacts are received within the socket body, and generally a corresponding number of solder ball are attached to the bottom of the contacts, respectively. The pick up cap serves two purposes: 1) It protects the contacts from being damaged and dust, and 2) It provides a comparably flat surface required for a pick-and-place robot to pick up the socket connector with a vacuum nozzle. The socket is first placed onto a PCB by the robot and then soldered onto the PCB in a reflow environment under a special temperature, so that the solder balls melt and joint with the soldering paste on the PCB, and are then cooled and solidified after the reflow soldering process. The socket connector is therefore soldered and positioned onto the PCB. In fact, during reflowing process, the periphery section of the housing is heated more quickly than the sheltered central portion of the housing so that the housing tends to easily warp upward away from the PCB and lift the periphery solder balls out of the solder paste on the PCB. So the soldering defect is resulted.

U.S. Pat. No. 6,875,022 issued to Hao-Yun Ma, on Apr. 5, 2005 discloses a socket connector that is able to overcome the defect discussed above. As shown in FIG. 2-FIG. 5 of Ma, the socket connector has a pick up cap mounted upon a socket body and having two cutouts thereon. During reflowing process, the cutout servers as a path allowing the heat to reach to an upper surface of the housing so as to provide the socket connector with a relatively even thermal environment. The pick up cap according to Ma is great for improving soldering quality. However, it could be more effective for protecting the contacts from potential mechanical damage and contamination if certain features are included and modified.

In view of the above, an improved socket connector is desired that is able to efficiently protect the contacts thereof and simultaneously ensure fine soldering quality is desired.

SUMMARY OF THE INVENTION

Accordingly, an object of the present invention is to provide an socket connector having dynamically vented pick up cap assembly that is good for protecting the contacts in the socket connector and also is excellent for improving heat delivery during a reflow process.

According to one aspect of the present invention there is provided a socket connector which includes an insulative housing defining an upper mating surface and a bottom surface, a plurality of contacts received in the housing, and a pick up cap assembly mounted upon the housing and covering the contacts. The pick up cap assembly includes a pick up cap having an opening exposed to contacts, and a deformable shield secured onto the pick up cap and covering the opening. The shield includes two layers having different coefficient of thermal expansion so that the shield warps upward when exposed to a heat, allowing heat to reach to the upper surface of the housing.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
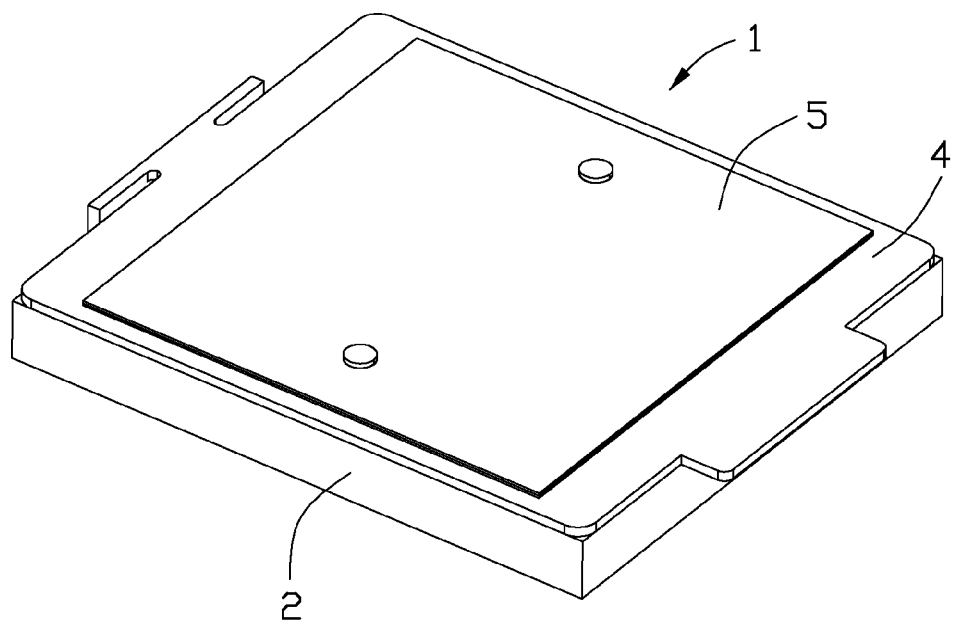
FIG. 1 is an assembled, perspective view of a socket connector in accordance with a preferred embodiment of the present invention.
Figure 2:
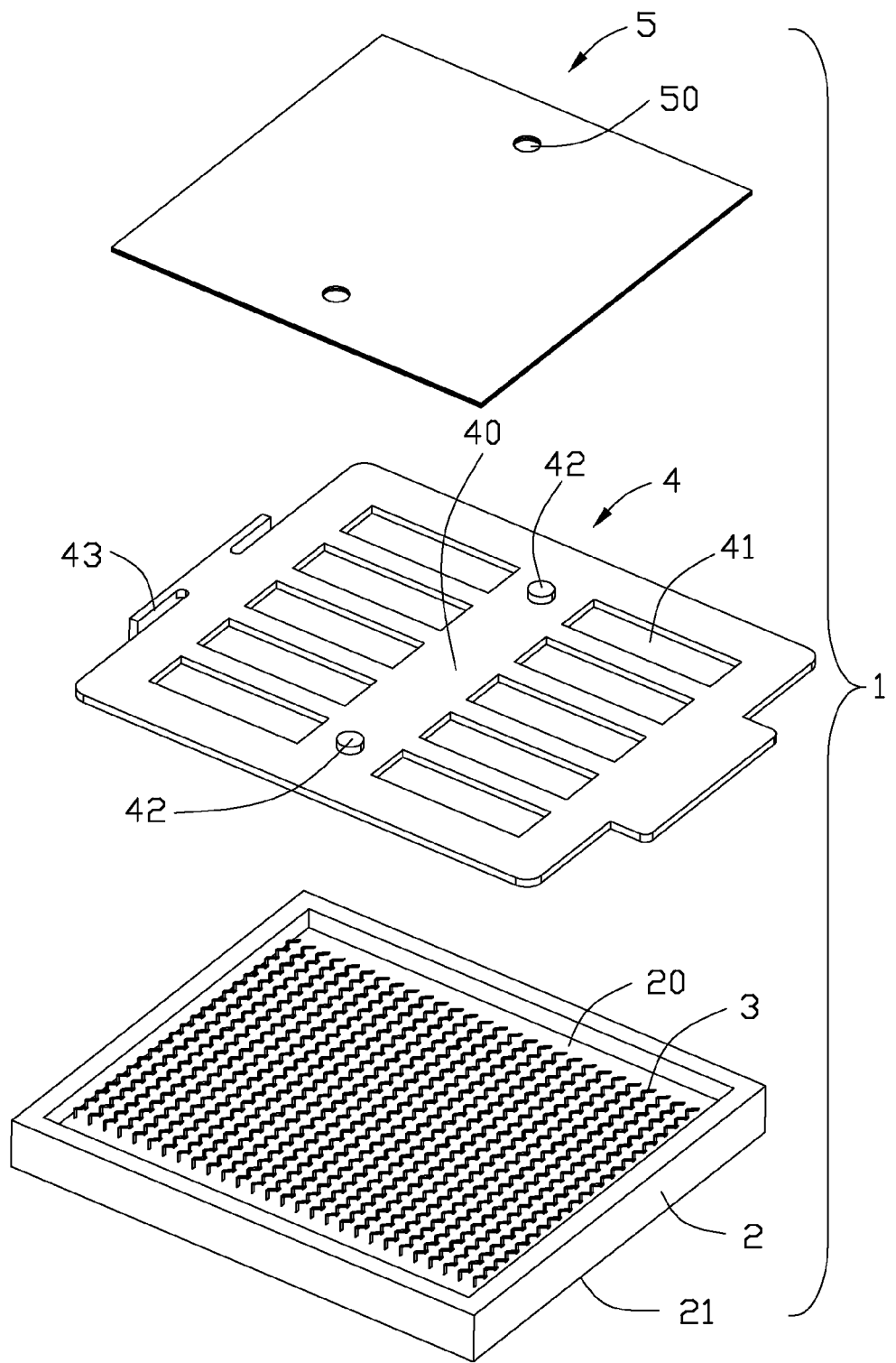
FIG. 2 is an exploded, perspective view of the socket connector shown in FIG. 1.

Referring to FIG. 1 and FIG. 2, a socket connector 1 made in accordance with the present invention includes an insulative housing 2 with a plurality of contacts 3 received therein, a pick up cap 4 mounted upon the housing 2, and a shield 5 secured onto the pick up cap 4. The housing 2 is substantially square in shape and defines an upper mating surface 20 and a bottom surface 21. The contacts 3 extend upward beyond the upper surface 20.

Figure 3:
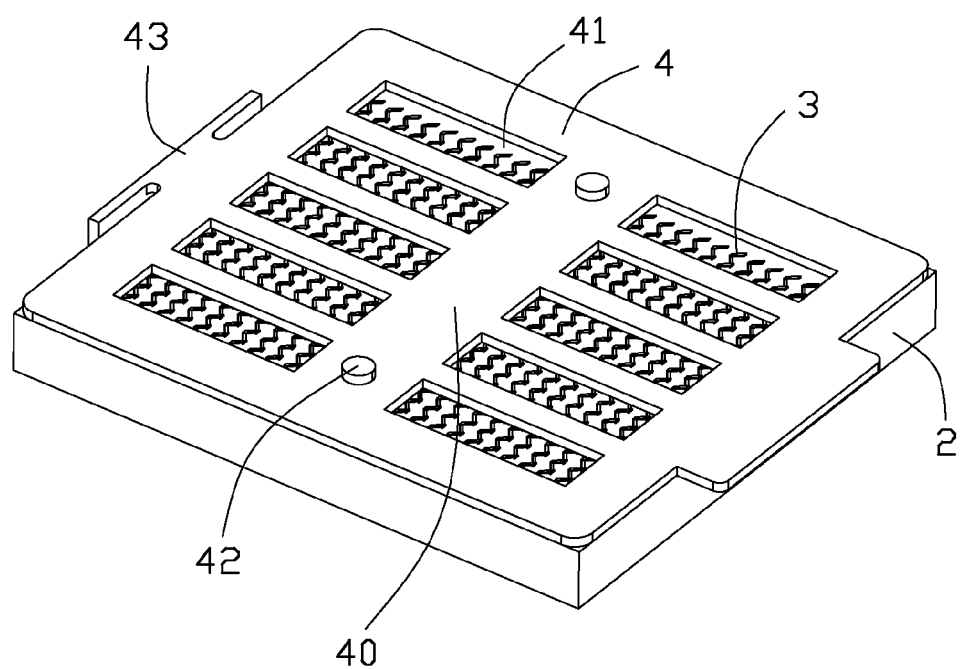
FIG. 3 is an assembled, perspective view of a housing and a pick up cap in accordance with the preferred embodiment of the present invention.
Figure 4:
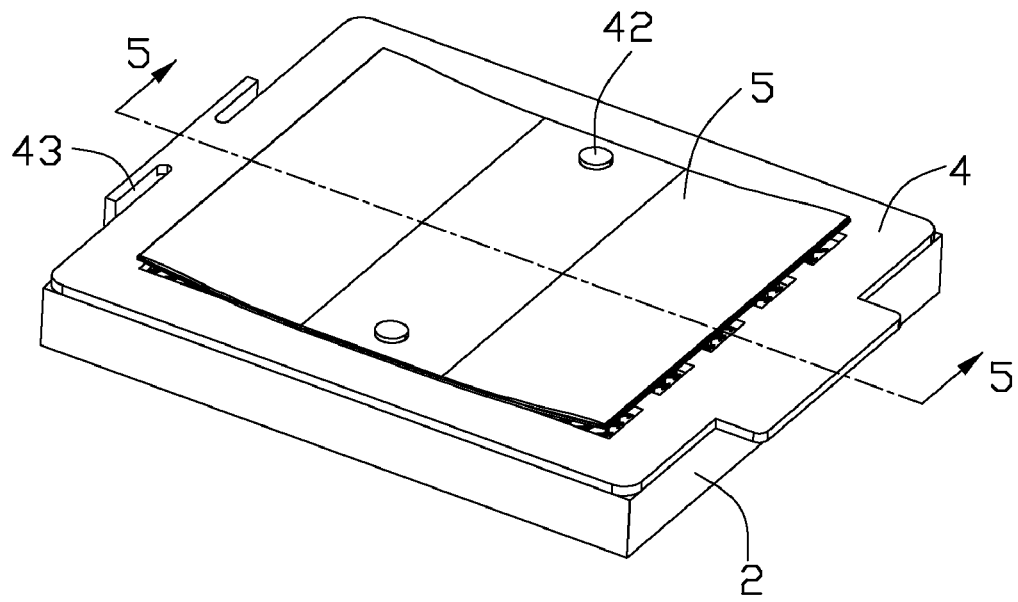
FIG. 4 is another assembled, perspective view of the socket connector, showing a shield is warping upward.
Figure 5:
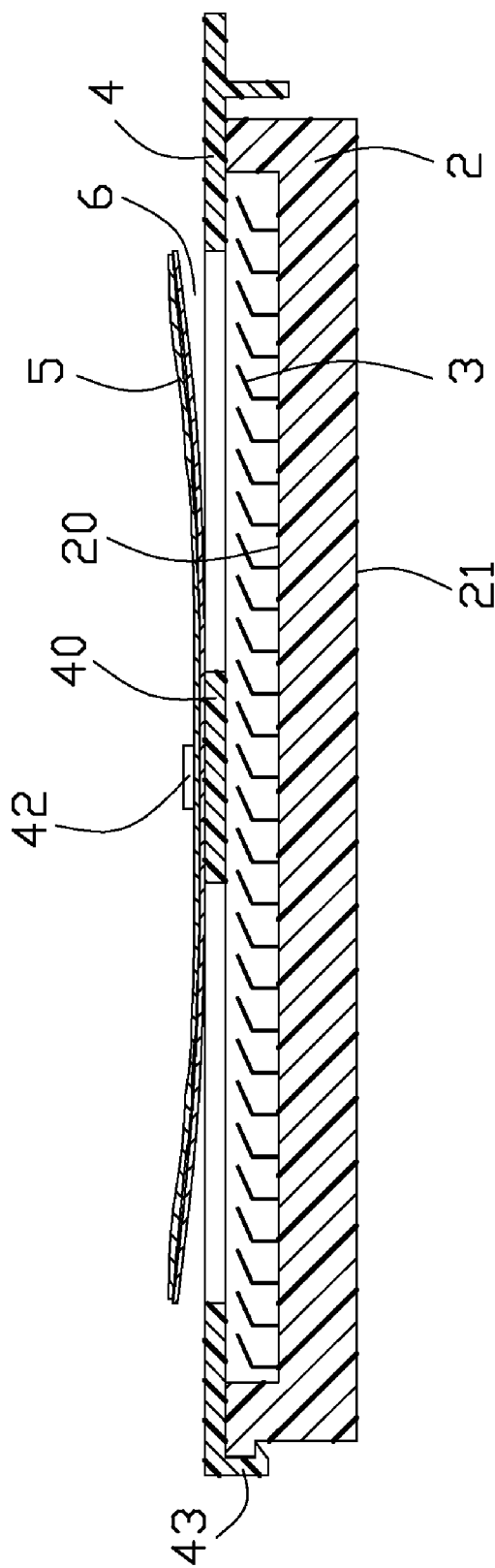
FIG. 5 is a cross-sectional view of the socket connector, taken along the line 5-5 in FIG. 4.

Particularly referring to FIG. 3 to FIG. 5, the pick up cap 4 is substantially square in shape corresponding to the housing 2, and includes a planar supporting portion 40 in a central position thereof. An array of openings 41 are formed therefrom at opposite sides of the supporting portion 40 and exposed to contacts 3 received in the housing 2. A pair of posts 42 are extending upwardly from the supporting portion for engaging with the shield 5. The pick up cap 4 further includes a latch 43 extending from one end thereof and engaging with the housing 2 so that the pick up cap 4 could be reliably attached onto the housing 2.

The shield 5 disposed on the pick up cap 4 is made of bimetal material in the preferred embodiment. The bimetal material generally includes two different layers of metallic sheets each with a different coefficient of thermal expansion (CTE) stacked and affixed to each other. For example, an upper layer of lower CTE is disposed upon a lower layer of higher CTE. The shield 5 further includes a pair of securing holes 50 corresponding to and engaging with the posts 42 on the pick up cap 4 so as to secure the shield 5 onto the pick up cap 4. Under a normal operating temperature, the shield 5 is flatly deployed over the pick up cap 4. Because of the difference in CTE, the two different layers of the shield 5 have different expansion amounts when exposed to a same heat source, so that the shield 5 deforms with two ends thereof warping upwardly. Two gaps 6 are therefore formed between two ends of the shield 5 and the pick up cap 4 so as to allow heat to reach to the upper surface 20 of the housing 2 via the openings 41, which performs heat ventilations, thereby keeping the housing 2 in a relatively even thermal environment. When the shield 5 is cooled down to the normal operating temperature, the shield 5 resumes to its original shape and the two ends thereof close back toward the openings 41 and finally cover the openings 41.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector, comprising:
    an insulative housing defining an upper surface and a bottom surface;
    a plurality of contacts received in the housing; and
    a pick up cap assembly mounted upon the housing and covering the contacts, comprising:
    a pick up cap having an opening exposed to contacts, and
    a deformable shield secured onto the pick up cap and covering the opening, the shield comprising two layers each having a different coefficient of thermal expansion so that the shield warps upward when exposed to a heat, allowing heat to reach to the upper surface of the housing.

2. The socket connector as claimed in claim 1, wherein the shield is made of bimetal material.

3. The socket connector as claimed in claim 1, wherein the pick up cap comprises a supporting surface located at approximately a central position thereof and two rows of said openings are respectively formed at opposite sides of the supporting surface.

4. The socket connector as claimed in claim 1, wherein the pick up cap comprises a pair of posts extending thereon and the shield has a pair of securing holes engaged with the posts.

5. A socket connector, comprising:
    an insulative housing defining an upper surface and a bottom surface;
    a plurality of contacts received in the housing;
    a pick up cap mounted upon the hosing and having an opening for heat delivery; and
    a deformable shield secured onto the pick up cap, the shield flatly covering the opening under a normal operating temperature, and warping away from the opening when exposed to an elevated temperature so as to allow heat to reach to the upper surface of the insulative housing, thereby keeping the insulative housing in a relatively even thermal environment, and when the shield is cooled down to the normal operating temperature, the shield warping toward the opening and finally covering the opening.

6. The socket connector as claimed in claim 5, wherein the shield has at least two materials each having a different coefficient of thermal expansion.

7. The socket connector as claimed in claim 6, wherein the shield is made of bimetal material.

8. The socket connector as claimed in claim 5, wherein the pick up cap comprises a supporting surface located at a relatively central position thereof and at least two said openings are formed by two opposite sides of the supporting surface.

9. The socket connector as claimed in claim 5, wherein the pick up cap comprises a pair of posts extending thereon and the shield has a pair of securing holes engaged with the posts.

10. An electrical assembly for mounting to a printed circuit board, comprising:
    a housing equipped with a plurality of contacts and exposed in an upward mating surface; and
    a pick-up device mounted upon the housing to cover said upward mating surface during a room temperature; wherein
    said pick-up device includes a deformable sheet which is not completely associated with the housing in a flatten manner but resulting in deformation at least in either a vertical direction during a heated circumstance for exposing said mating port and performing heat ventilation between the mating port and an exterior.

11. The electrical assembly as claimed in claim 10, wherein said deformable sheet essentially defines a stationary center region while allowing two opposite end regions to be upward deflected.

12. The electrical assembly as claim claimed in claim 10, wherein said pick-up device further includes an insulative cap located between the housing and the sheet under condition that the cap is attached to the housing and the sheet is attached to the cap.

13. The electrical assembly as claimed in claim 12, wherein said cap defines a plurality of openings for heat ventilation.

14. The electrical assembly as claimed in claim 10, wherein said sheet includes two layers with different CTEs (Coefficient of Thermal Expansion) for deformation.

* * * * *